United States Patent
Oishi

(10) Patent No.: US 7,405,114 B2
(45) Date of Patent: Jul. 29, 2008

(54) LASER IRRADIATION APPARATUS AND METHOD OF MANUFACTURING SEMICONDUCTOR DEVICE

(75) Inventor: Hirotada Oishi, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 107 days.

(21) Appl. No.: 10/684,416

(22) Filed: Oct. 15, 2003

(65) Prior Publication Data

US 2004/0074881 A1 Apr. 22, 2004

(30) Foreign Application Priority Data

Oct. 16, 2002 (JP) .............................. 2002-301896

(51) Int. Cl.
*H01L 21/00* (2006.01)
*H01L 21/84* (2006.01)

(52) U.S. Cl. ...................................... 438/166; 438/487

(58) Field of Classification Search ............ 219/121.65, 219/121.66, 121.73–121.75; 438/487, 166, 438/486, 795
See application file for complete search history.

(56) References Cited

U.S. PATENT DOCUMENTS

| | | | |
|---|---|---|---|
| 4,530,600 A | | 7/1985 | Lopez |
| 4,599,133 A | * | 7/1986 | Miyao et al. ................... 117/45 |
| 4,662,949 A | * | 5/1987 | Inoue et al. .................... 117/43 |
| 4,674,824 A | * | 6/1987 | Goodman et al. ............... 359/7 |
| 5,150,228 A | * | 9/1992 | Liu et al. ........................ 359/7 |
| 5,357,365 A | * | 10/1994 | Ipposhi et al. ............... 359/205 |
| 5,452,382 A | * | 9/1995 | Shionoya et al. .............. 385/11 |
| 5,754,571 A | | 5/1998 | Endoh et al. |
| 5,854,803 A | | 12/1998 | Yamazaki et al. |
| 5,861,337 A | * | 1/1999 | Zhang et al. ................. 438/437 |
| 6,080,643 A | * | 6/2000 | Noguchi et al. ............. 438/487 |
| 6,169,830 B1 | * | 1/2001 | Kewitsch et al. .............. 385/37 |
| 6,452,710 B1 | * | 9/2002 | Hiraga et al. ................ 359/244 |
| 6,455,359 B1 | * | 9/2002 | Yamazaki et al. ........... 438/166 |
| 6,472,295 B1 | * | 10/2002 | Morris et al. ................ 438/463 |
| 6,563,077 B2 | * | 5/2003 | Im ......................... 219/121.65 |
| 6,593,215 B2 | * | 7/2003 | Mori et al. ................... 438/486 |

(Continued)

FOREIGN PATENT DOCUMENTS

JP          363009038 A * 1/1988

(Continued)

*Primary Examiner*—Samuel M Heinrich
(74) *Attorney, Agent, or Firm*—Eric J. Robinson; Robinson Intellectual Property Law Office, P.C.

(57) ABSTRACT

The present invention provides the laser irradiation apparatus that has a galvanometer mirror and an f-θ lens optical system, can offset the change of the energy due to the transmittance change of the f-θ lens, and can scan a laser beam while the change of the energy on a substrate is suppressed. Further, the laser beam energy that is incident on the lens is controlled in advance by combining the optical system changing the branching ratio of polarization of the laser beam and the optical system having dependence on direction of polarization of the laser beam and changed continuously according to the transmittance of the lens on which the laser beam is incident. The laser energy is controlled to offset the transmittance of the lens, and thereby energy fluctuation of the laser beam irradiation of a substrate can be prevented.

36 Claims, 11 Drawing Sheets

U.S. PATENT DOCUMENTS

| | | | |
|---|---|---|---|
| 6,621,044 B2 * | 9/2003 | Jain et al. | 219/121.7 |
| 6,639,177 B2 * | 10/2003 | Ehrmann et al. | 219/121.68 |
| 6,717,101 B2 * | 4/2004 | Morris et al. | 219/121.67 |
| 6,770,546 B2 * | 8/2004 | Yamazaki | 438/487 |
| 6,777,645 B2 * | 8/2004 | Ehrmann et al. | 219/121.73 |
| 6,809,291 B1 * | 10/2004 | Neil et al. | 219/121.76 |
| 6,822,977 B1 * | 11/2004 | Stamm et al. | 372/9 |
| 6,849,825 B2 * | 2/2005 | Tanaka | 219/121.82 |
| 6,852,947 B2 * | 2/2005 | Tanaka | 219/121.76 |
| 6,916,693 B2 * | 7/2005 | Ohnuma et al. | 438/162 |
| 7,115,454 B2 * | 10/2006 | Hatano et al. | 438/166 |
| 2002/0137311 A1 | 9/2002 | Timans | 438/487 |
| 2002/0141473 A1 * | 10/2002 | Cordingley et al. | 372/106 |
| 2003/0021307 A1 * | 1/2003 | Yamazaki | 372/24 |
| 2003/0100169 A1 * | 5/2003 | Tanaka et al. | 438/487 |
| 2003/0224587 A1 * | 12/2003 | Yamazaki et al. | 438/487 |
| 2004/0065643 A1 * | 4/2004 | Tanaka | 219/121.8 |
| 2004/0106237 A1 * | 6/2004 | Yamazaki | 438/149 |
| 2005/0155956 A1 * | 7/2005 | Hamada et al. | 219/121.69 |
| 2005/0233512 A1 * | 10/2005 | Tanaka et al. | 438/166 |
| 2006/0056276 A1 * | 3/2006 | Shimano et al. | 369/112.02 |

FOREIGN PATENT DOCUMENTS

| | | | |
|---|---|---|---|
| JP | 63-123588 | | 5/1988 |
| JP | 363123588 A | * | 5/1988 |
| JP | 401115117 A | * | 5/1989 |
| JP | 404002902 A | * | 1/1992 |
| JP | 404301245 A | * | 10/1992 |
| JP | 406140704 A | * | 5/1994 |
| JP | 08-195357 | | 7/1996 |
| JP | 10-082965 | | 3/1998 |
| JP | 10-313146 | | 11/1998 |
| JP | 410313146 A | * | 11/1998 |
| JP | 02002190454 A | * | 7/2002 |

* cited by examiner

LASER IRRADIATION APPARATUS AND METHOD OF MANUFACTURING SEMICONDUCTOR DEVICE

BACKGROUND OF THE INVENTION

1. Field of the Invention

The present invention relates to a laser irradiation apparatus for crystallizing a semiconductor film and the like or for activating the semiconductor film after ion implantation by using a laser beam. Specifically, the present invention relates to a laser irradiation apparatus for irradiating the laser beam on a semiconductor film which is polycrystalline or similar to polycrystalline and enhancing crystallinity of the semiconductor film. Further, the present invention relates to a method of manufacturing semiconductor device using a crystalline semiconductor film formed by the laser irradiation apparatus.

2. Description of the Related Art

In recent years, the technology for forming a thin film transistor (TFT) over a substrate has made great progress and such a TFT has been developed and applied to an active matrix semiconductor device. Particularly, a TFT made by using a polycrystalline semiconductor film is superior in field-effect mobility to a conventional TFT with an amorphous semiconductor film and thus, high-speed operation becomes possible. Therefore, it is possible that control of a pixel is performed by a driver circuit that is provided over the same substrate as the pixel, instead of being performed by a driver circuit provided outside of the substrate.

Incidentally, a substrate for a semiconductor device is expected to be a glass substrate rather than a single crystalline silicon substrate in terms of the cost. However, a glass substrate is inferior in heat resistance and the shape thereof is changed easily by heating. Therefore, when a polysilicon TFT is formed over a glass substrate, in order to prevent the heat distortion, laser annealing is often performed to crystallize a semiconductor film.

The characteristic of laser annealing is that the processing time can be drastically shortened as compared with other annealing methods by radiation heating or conductive heating, and that a semiconductor substrate or a semiconductor film can be heated selectively and locally, so that the substrate is hardly damaged thermally.

It is noted that the laser annealing method described here is the technology to recrystallize an amorphous layer formed over a semiconductor substrate or a semiconductor film, or the technology to crystallize an amorphous semiconductor film formed over a substrate. Moreover, the technology to flatten or modify a surface of a semiconductor substrate or a semiconductor film is also included.

Lasers used for laser annealing are broadly classified into two sorts according to their oscillation sorts. One type is a pulsed laser sort and the other sort is a continuous wave laser sort. In recent years, it has been known that in crystallization of the semiconductor film, a crystal grain formed in the semiconductor film is larger by using a continuous wave laser than by using a pulsed laser. When the diameter of a crystal grain formed in a semiconductor film is large, the number of grain boundaries in a channel region of a TFT formed by using the semiconductor film decreases, and thereby enhancing the mobility. As a result, such semiconductor film can be applied to a device with high-performance. For this reason, continuous wave lasers have attracted attention.

Moreover, when laser annealing is performed on a semiconductor or a semiconductor film, a method for shaping a laser beam emitted from a laser into a linear shape or an elliptic shape by an optical system and scanning a beam spot (surface to be irradiated) to a surface to be irradiated is known. Since this method enables an effective irradiation of a laser beam on a substrate and enhances mass-productivity, this method is employed industrially preferably (Reference 1: Japanese Patent Laid Open No. Hei 8-195357).

In order to perform laser annealing on a semiconductor film formed over a substrate effectively, a method for shaping a spot of a laser beam emitted from a continuous wave laser into a linear shape or an elliptic shape by an optical system, and scanning the shaped beam over the substrate is employed.

In addition, a galvanometer mirror is used as a means for scanning a laser beam. The laser beam that is incident on the galvanometer mirror is deflected toward the substrate. By oscillating the galvanometer mirror to control the oscillating angle of the galvanometer mirror, the deflected laser beam can be scanned on the whole substrate. With the structure in which the laser beam can be scanned by only oscillating the galvanometer mirror, it is not necessary any more to move the substrate back and forth on a stage and the like, and thereby it becomes possible to conduct laser irradiation in a short time.

It becomes possible to focus the beam deflected by the galvanometer mirror constantly on the plane surface by converging the beam with an f-θ lens. The beam deflected by the galvanometer mirror is scanned from the edge to the center of the lens to scan the semiconductor film arranged on the plane surface. However, since the f-θ lens used as a means for converging a laser beam has different transmittance in the center and in the edge of the lens, when the f-θ lens is used for laser crystallization the energy distribution of the laser beam irradiation of the semiconductor film is not uniform and thus, the whole semiconductor film cannot be irradiated uniformly with the laser beam. When a semiconductor film is irradiated with a laser beam, however, it is required to process uniformly the semiconductor film by irradiating the laser beam uniformly. Therefore, a means for offsetting the difference in the energy distribution due to the difference of the transmittance of the lens and equalizing the irradiation energy of the laser beam on the surface to be irradiated have been required.

SUMMARY OF THE INVENTION

In view of the problems mentioned above, it is an object of the present invention to provide a continuous wave laser irradiation apparatus and to provide a pulsed laser irradiation apparatus, in which a surface of an object is irradiated with a laser beam efficiently and uniformly. Further, it is another object to provide a method of manufacturing a semiconductor device by using the laser irradiation apparatus.

It is noted that a laser irradiation apparatus of the present invention has a laser oscillator (a first means) and an optical system (a first optical system or a second means) for shaping a laser beam emitted from the laser oscillator. An object is irradiated with the laser beam shaped through an optical system 104 by a means for deflecting (a third means) the beam toward a substrate. Also, the laser irradiation apparatus has a fourth means (a forth optical system) for constantly making the laser beam an image formation at a desired position on a thin film formed over the plane substrate. Further, the laser irradiation apparatus has an optical system (a third optical system or a fifth means) having dependency on the direction of polarization (hereinafter referred to as polarization dependency) of the laser beam and an optical system (a second optical system or a sixth means) for controlling the branching ratio of polarization of the laser beam. In the structure according to the present invention, the sixth means is controlled in order to offset a difference in beam energy caused by the forth means.

It is noted that the deflection is made by giving the laser beam a phase-change that has a linear gradient in the cross section of the laser beam. For example, when a plane mirror is rotated by θ to an incident beam, the reflection beam is deflected by 2θ. A rotation reflection-type light deflector and a rotation polygonal mirror are manufactured by applying the deflection, and a galvanometer mirror and a polygon mirror are given as examples.

In other words, the laser irradiation apparatus of the present invention having a galvanometer mirror and an f-θ lens optical system, can offset the change of the energy due to the transmittance change of the f-θ lens, and can scan a laser beam while the fluctuation of the energy on a substrate is suppressed (an object to be irradiated).

A beam is scanned by a galvanometer mirror. Generally, the energy is, however, highest in the vicinity of the center of the substrate, and the energy becomes attenuated toward the edges of the substrate due to the difference in the transmittance of the lens. And the transmittance of the lens changes continuously by location, so that the energy of the transmitted beam also changes continuously. Therefore, the energy of the laser beam that is incident on the lens is controlled in advance by combining the optical system changing the branching ratio of polarization of the laser beam and the optical system having polarization dependency on the laser beam and changed continuously according to the transmittance of the position of the lens on which the laser beam is incident. It is noted that the branching ratio of polarization described here means a ratio of a maximum amplitude of a p-polarized light component to a maximum amplitude of a s-polarized light component in resolution of an electric field vector of polarized light into a p-polarization direction and a s-polarization direction. The laser energy is controlled to offset the transmittance of the lens, and thereby energy fluctuation in the laser beam irradiation of the substrate can be prevented.

By the laser irradiation apparatus of the present invention above, an object can be irradiated with the laser beam at high speed. In addition, the whole surface of a substrate can be crystallized uniformly.

Note that lasers are widely used in various fields of industrial application. And the present invention can be applied not only to a laser annealing method for a semiconductor film but also to other methods using a laser such as a laser printer.

DETAILED DESCRIPTION OF THE PREFERRED EMBODIMENTS

Embodiment Mode

A structure of a laser irradiation apparatus according to the present invention is described hereinafter.

Figure 1:
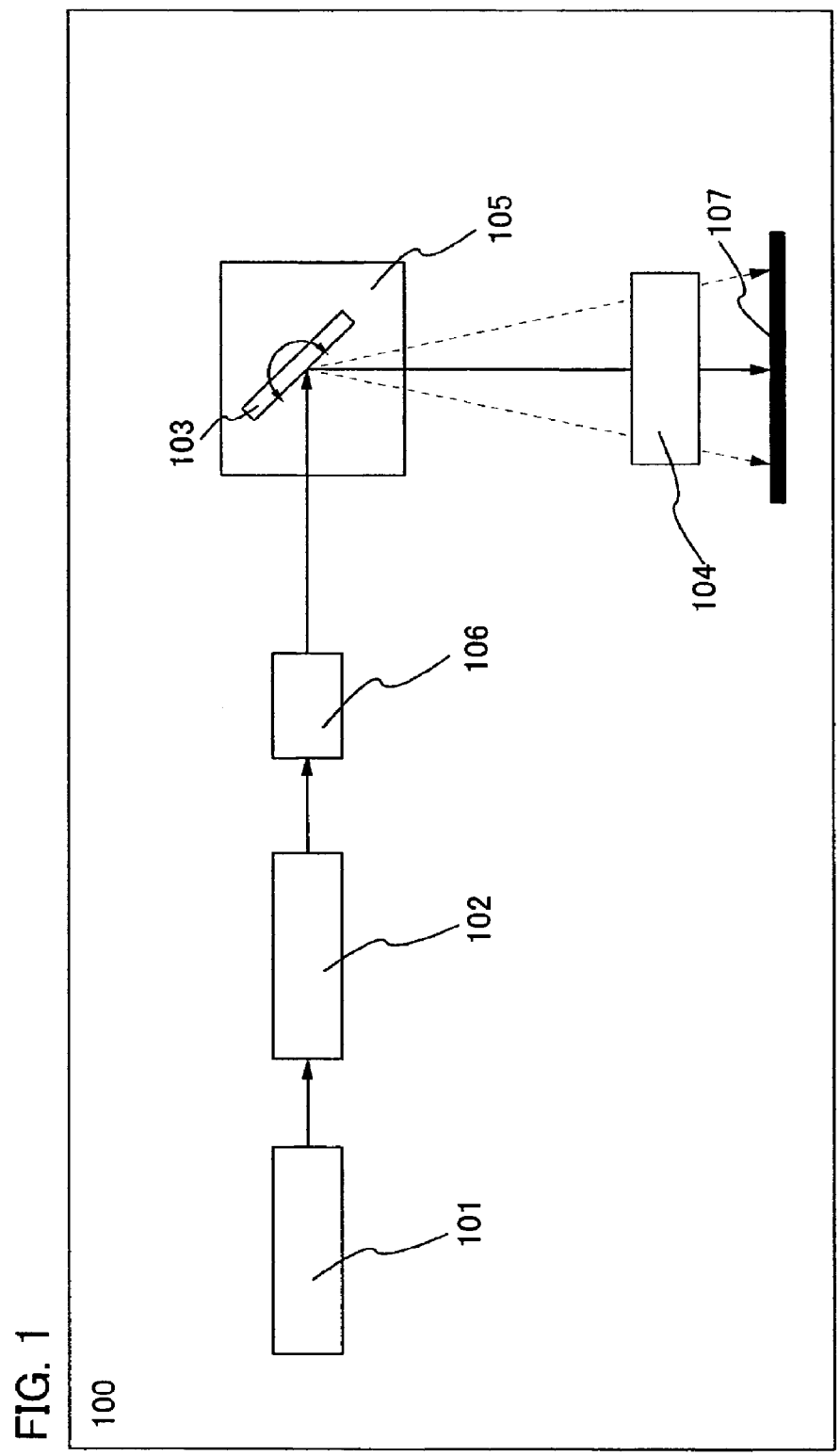
FIG. 1 is a schematic diagram of a laser irradiation apparatus of the present invention.

FIG. 1 shows a schematic diagram of a laser irradiation apparatus of the present invention. A laser irradiation apparatus 100 of the present invention includes a laser oscillator 101 that corresponds to a first means for oscillating a laser beam. It is noted that FIG. 1 shows an example in which one laser oscillator 101 is provided. However, the number of the laser oscillator in the laser irradiation apparatus 100 of the present invention is not limited to one. When a plurality of laser oscillators is used, the beam spots can be unified into one spot by overlapping each beam spot of the laser beam emitted from each laser oscillator.

The laser can be changed appropriately depending on the purpose of the process. Well-known laser can be used in the present invention. A continuous oscillation gas laser or solid state laser can be used as the laser oscillator. An Ar laser and a Kr laser are given as the gas laser, while a YAG laser, a $YVO_4$ laser, a YLF laser, a $YAlO_3$ laser, a $Y_2O_3$ laser, an Alexandrite laser, and a Ti: sapphire laser are given as the solid state laser. The harmonic wave with respect to the fundamental wave can be obtained by using a nonlinear optical element.

In addition, after an infrared laser beam emitted from the solid state laser is converted into a green laser beam by using the nonlinear optical element, the green laser beam is further converted into an ultraviolet laser beam by using another nonlinear optical element. And the ultraviolet laser beam may be used.

Moreover, the laser irradiation apparatus 100 includes an optical system 102 that corresponds to the second means for shaping the beam spot on an object to be irradiated of the laser beam emitted from the laser oscillator 101.

The shape of the beam spot of the laser beam emitted from the laser oscillator 101 on an object to be irradiated 107 is linear shape or elliptical shape. It is noted that the shape of the laser beam emitted from the laser depends on the type of the laser. In the case of a YAG laser, when the rod shape is cylindrical, the shape of the laser beam becomes circular. On the other hand, when the rod shape is slab type, it becomes rectangular. It is noted that when a laser beam is emitted from the slab type laser, its shape is changed significantly depending on the distance from the laser beam window, because the divergence angle of the laser beam emitted from the slab type laser differs vastly in lengthwise and crosswise direction. The laser beam like this can be formed into line shaped or elliptical shaped laser beam as desired by the optical system 102.

Moreover, when plural laser oscillators are used, the spots of the laser beam emitted from these laser oscillators may be overlapped each other to form one beam spot by the optical system.

The laser irradiation apparatus 100 of the present invention includes a galvanometer mirror 103 that corresponds to the third means for determining the irradiation position of the laser beam with respect to the object to be irradiated 107. By operating the galvanometer mirror 103 to change the incident angle and the reflecting angle of the laser beam, the irradiation position of the laser beam on the object to be irradiated 107 can be moved (scanned), or the scanning direction of the laser beam can be changed. The laser beam can be scanned on the whole surface of the object to be irradiated 107 by operating the galvanometer mirror.

The laser irradiation apparatus 100 of the present invention includes an optical system 104 that corresponds to the fourth means. The optical system 104 has a function to converge the spot of the laser beam on the object to be irradiated 107. An f-θ lens is used for the optical system 104. Note that, a telecentric f-θ lens may be used for the f-θ lens. By using the telecentric f-θ lens, the incident angle of the laser beam transmitted through the lens to the object to be irradiated 107 is made constant, and the reflectance of the object to be irradiated 107 can be kept constant.

Further, the laser irradiation apparatus 100 of the present invention has an optical system 105 that corresponds to the fifth means. The optical system 105 has reflectance or/and transmittance depending on a direction of polarization of the laser beam. As the optical system 105, a galvanometer mirror having a reflectance depending on a direction of polarization of the laser beam or a beam splitter having a reflectance and transmittance may be used.

Furthermore, the laser irradiation apparatus 100 of the present invention has an optical system 106 that corresponds to the sixth means. A half-wave plate is used as the sixth means. The half-wave plate is arranged ahead of the galvanometer mirror. In the apparatus, the branching ratio of polarization of the laser beam is changed by rotating the half-wave plate, so that the laser beam can be incident on the optical system 105. The energy of the laser beam transmitted or reflected can be controlled by changing the branching ratio of polarization of the laser beam, since the optical system 105 has polarization dependency. According to the above described structures, a energy difference of laser beam caused by the change of transmittance of the optical system 104 can be offset. Note that the optical system 106 corresponding to the sixth means illustrated in FIG. 1 is disposed between the optical system 102 and the optical system 105, however, the present invention is not limited thereto. The optical system 106 may be disposed anywhere between optical system 105 corresponding to the fifth means and the laser oscillator 101, for example, the optical system 106 may be disposed between laser oscillator 101 and the optical system 102.

And a high-quality semiconductor device can be obtained by conducting laser annealing by using the laser irradiation apparatus of the present invention. In addition, a TFT in which fluctuation in electronic characteristic is reduced can be obtained by using the semiconductor film.

Embodiment 1

This embodiment describes a structure in which a half-wave plate and a beam splitter are interposed between an optical system for shaping a beam and a galvanometer mirror.

Figure 2:
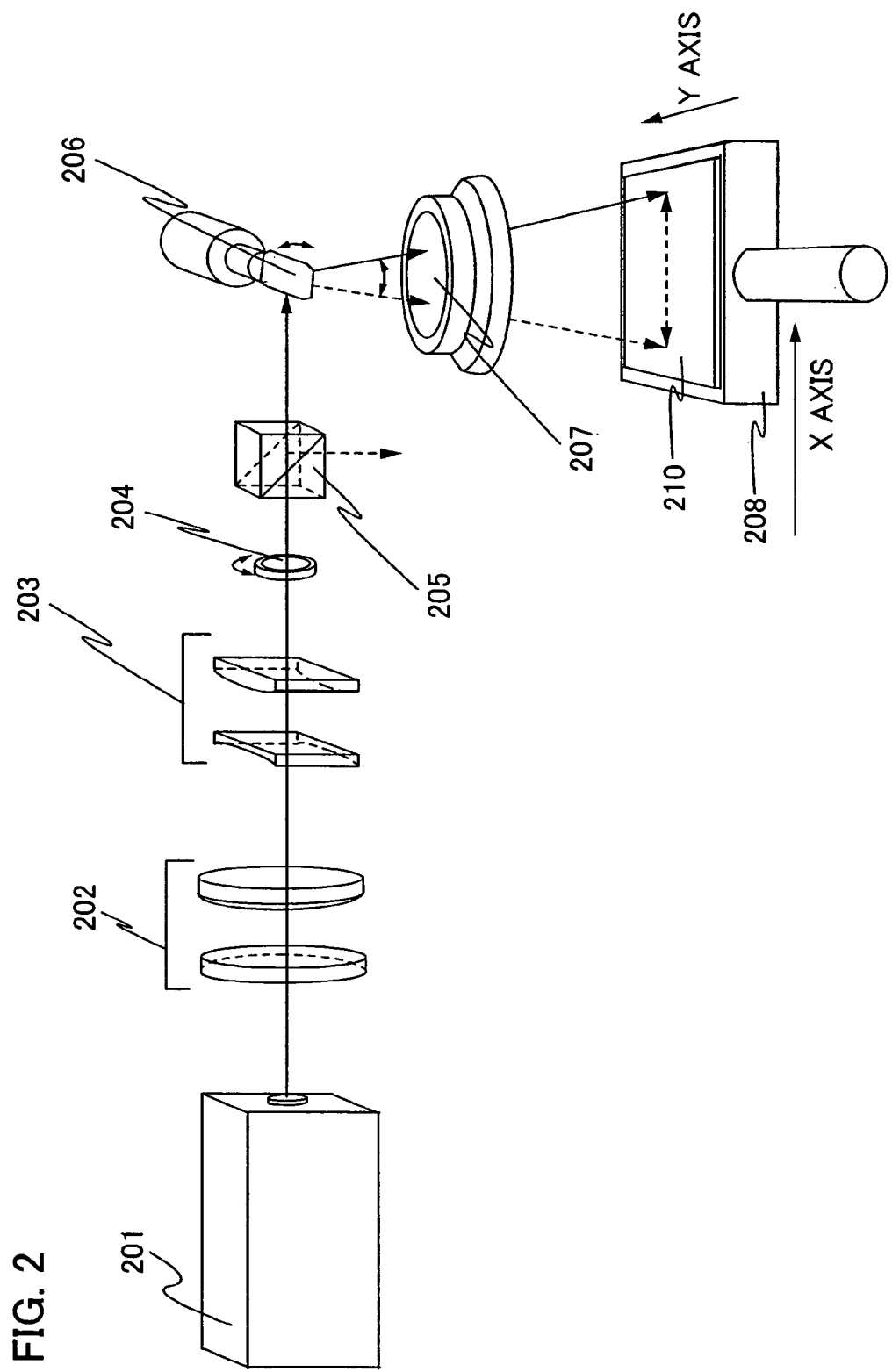
FIG. 2 shows a laser irradiation apparatus according to the present invention.

FIG. 2 shows an example of a laser irradiation apparatus. The description given here is about a case in which a laser beam emitted from a laser oscillator 201 is linearly p-polarized light beam (light beam is hereinafter referred to as beam) according to the polarization characteristic of the laser. A laser beam emitted from the laser oscillator 201 is shaped into a linear beam by a beam expander 202 and a cylindrical lens 203.

The shaped beam enters a half-wave plate 204. The half-wave plate 204 rotates about the normal line that runs in the center of the incident plane, thereby changing the branching ratio of polarization of the laser beam. In this way, the ratio of p-polarized laser beam in transmitted beam from the half-wave plate 204 can be increased or decreased.

The laser beam that has been transmitted through the half-wave plate 204 enters a beam splitter 205 to be split into a transmitted beam and a reflected beam. The beam splitter 205 used in this structure is preferably a polarization beam splitter which has a polarization dependency so that the transmittance depends strongly on the polarization direction of the laser beam. Given as an example here is a case of using a polarization beam splitter that has a 98% transmittance for p-polarized beam and a 2% transmittance for s-polarized beam. Beams that are transmitted through the beam splitter 205 are mainly p-polarized beam and beams that are reflected by the beam splitter 205 are mainly s-polarized beam. When a laser beam enters the half-wave plate 204 in a manner that positions the oscillation direction of the incident beam in parallel to the optical axis direction of the half-wave plate 204, the laser beam, which is p-polarized beam, is transmitted through the beam splitter 205 with a minimum energy loss. On the other hand, if the half-wave plate 204 is rotated such that the oscillation direction of the incident beam and the optical axis of the half-wave plate 204 form an angle θ, the ratio of s-polarized beam in a laser beam that is transmitted through half-wave plate 204 is increased and accordingly an increased ratio of beam is reflected by the beam splitter 205. As a result, the energy of laser beam transmitted through the beam splitter 205 is decreased. The branching ratio of polarization of the laser beam incident upon the beam splitter 205 can be controlled by the angle of rotation of the half-wave plate 204, thereby making it possible to control the energy of beam transmitted through the beam splitter 205. This apparatus utilizes a transmitted beam from the beam splitter 205 for laser irradiation of a substrate 210. Therefore, the substrate 210 can be irradiated with the laser beam while controlling the energy of the laser beam.

A galvanometer mirror 206 and an f-θ lens 207 are placed above the substrate 210. The transmitted beam from the beam splitter 205 enters the galvanometer mirror 206. The galvanometer mirror 206 can polarize the laser beam toward the substrate direction. The incident angle and reflection angle of a laser beam can be controlled for laser beam scanning by adjusting the oscillating angle of the galvanometer mirror 206.

Figure 3A:
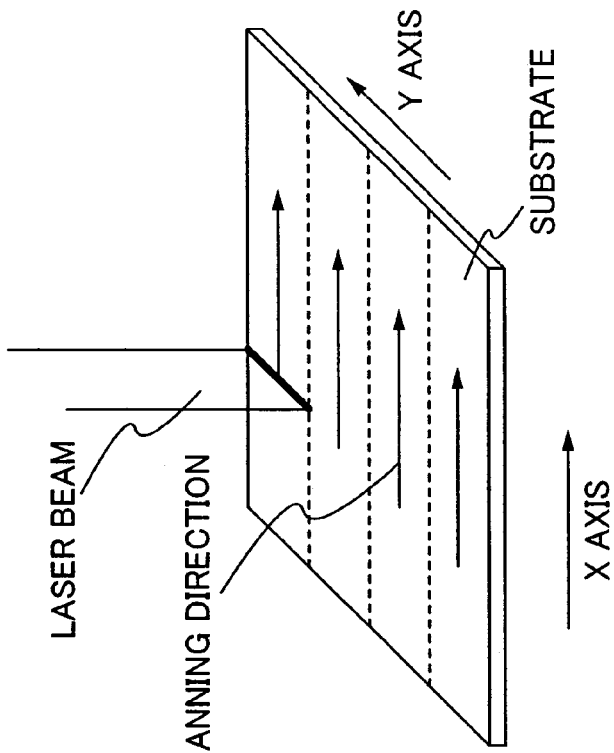
FIGS. 3A and 3B show a process of laser scanning of the present invention.
Figure 3B:
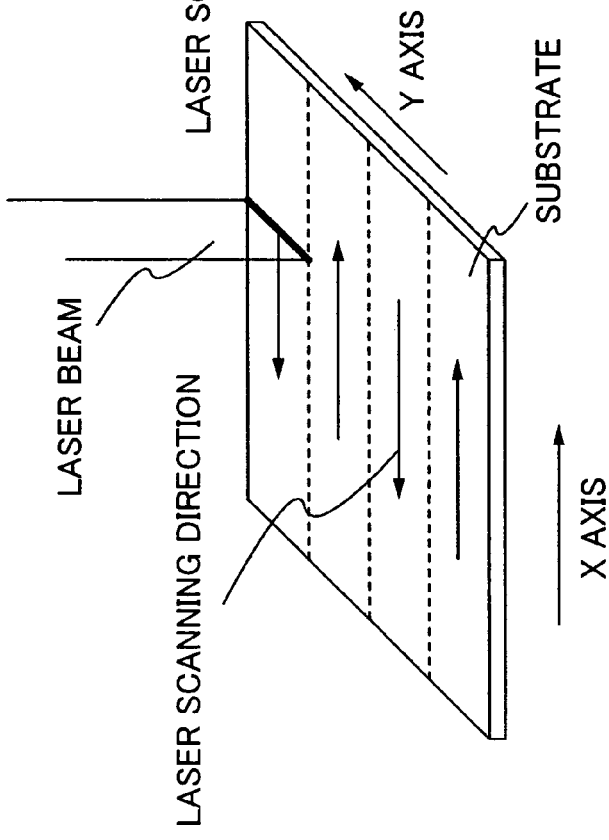

The galvanometer mirror 206 scans the laser beam in the direction of an X axis in FIGS. 3A and 3B. After the direction of X axis scanning is finished, a movable stage 208 moves the substrate in the direction of Y axis by a distance corresponding to the beam width at a time. The scanning by the galvanometer mirror 206 is repeated to irradiate the entire surface of the substrate 210. For the laser beam scanning, a linear beam may be scanned to and fro along the X axis as shown in FIG. 3A or in one direction as shown in FIG. 3B.

Figure 4A:
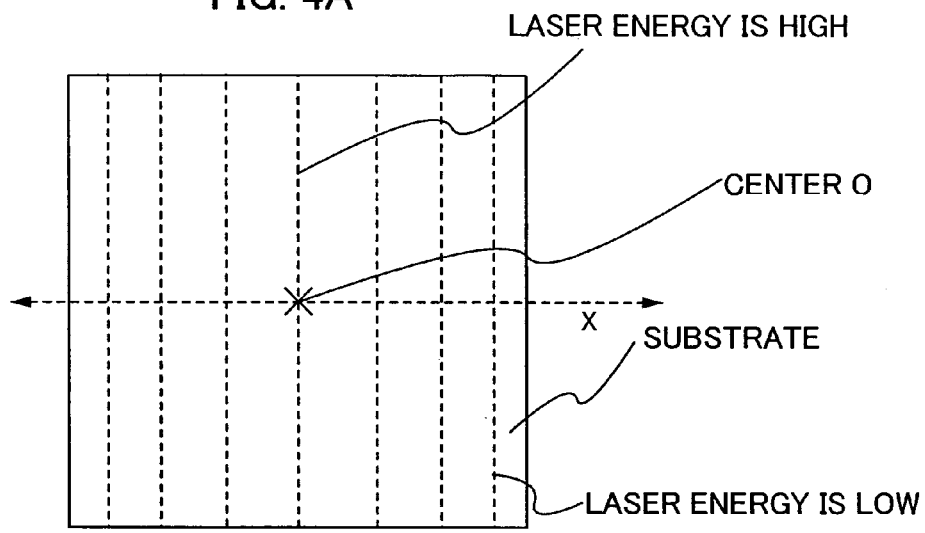
FIGS. 4A and 4B show an example of energy change in the laser beam by changing of transmittance of a lens.
Figure 4B:
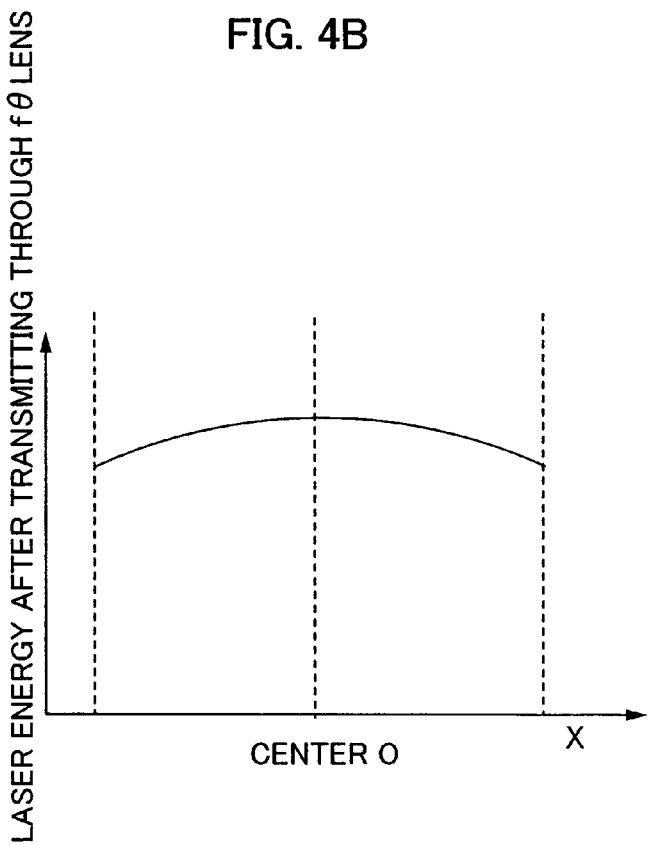

The beam polarized by the galvanometer 206 enters the f-θ lens 207 to be collected on the substrate 210. Usually, the transmittance of a lens is varied depending on the position at which laser beam enters the lens and the laser energy applied to the substrate 210 is accordingly changed. Given here as an example is a case of controlling the operation of the galvanometer mirror such that laser beam scans the top face of the substrate at a constant rate. The lens transmittance varies from one location to another and therefore a change in transmittance causes a change in energy of laser beam being scanned over the object surface. FIGS. 4A and 4B show an example of changes in irradiation energy of laser beam scanned on the top face of the substrate. It is understood from FIGS. 4A and 4B that the laser intensity is high around the center of the substrate and is lowered toward the edges of the substrate.

Figure 5A:
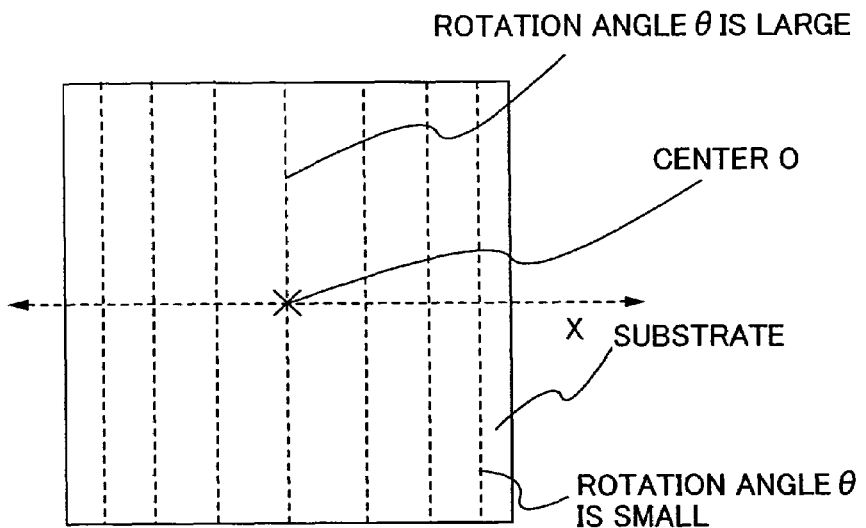
FIGS. 5A and 5B show an example of rotation angle of half-wave plate according to the present invention of the present invention.
Figure 5B:
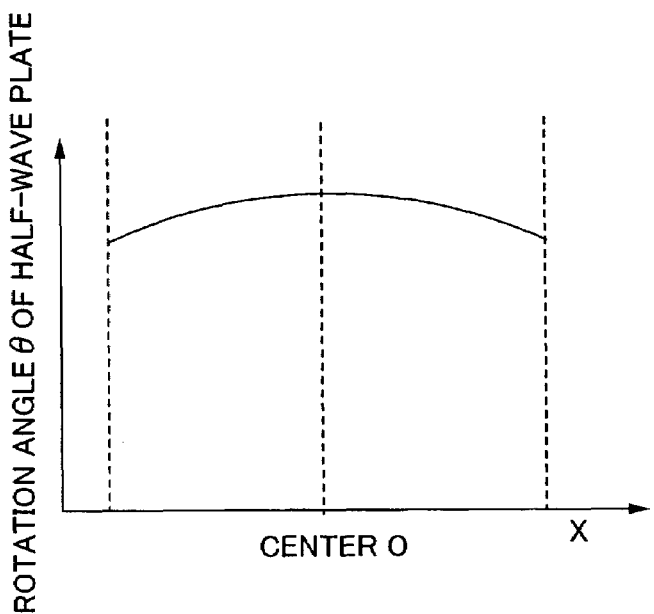

In this apparatus, during beam scanning by the galvanometer mirror 206, the optical axis of the half-wave plate 204 is rotated with respect to the oscillation direction of laser beam that enters the half-wave plate 204 so that the branching ratio of polarization is controlled at the same time. Thus, the laser beam energy applied to the substrate 210 is controlled. An angle of rotation of the half-wave plate 204 is controlled continuously to form a speed change pattern that can offset a beam energy change caused by a change in transmittance of the f-θ lens 207. FIGS. 5A and 5B shows an example of rotation angle distribution of half-wave plate which can offset the beam energy changes shown in FIG. 4B. This apparatus employs the distribution shown in FIG. 5B to control the rotation of the half-wave plate. An angle of rotation of the half-wave plate is set to from 0° to 45°. Through laser irradiation with the above structure, crystallization is achieved all over the substrate 210 while controlling changes in energy applied to the substrate 210 and in annealing efficiency. Reduction of changes in irradiation energy applied to the top face of the substrate also means that the width of a region where crystals formed in laser irradiation tracks has a grain size of 10 μm or more (a large grain size region) can be kept constant. Preferably, the branching ratio of polarization may be controlled in accordance with a desired width of a large grain size region, the material and thickness of the semiconductor film, and the like. The f-θ lens 207 here may be a telecentric lens. When a telecentric lens is used as the f-θ lens 207, a laser beam can enter the substrate 210 at a constant angle irrespective of which part of the lens the laser beam enters and therefore the reflectance of the irradiation object can be kept constant. When the substrate receiving laser irradiation is a glass substrate or a similar substrate transmissive of laser beam, interference fringes may appear on the substrate due to a beam reflected by the front side of the substrate and a beam reflected by the rear side of the substrate. For that reason, laser beam may enter obliquely with respect to the substrate.

The surface of the beam splitter 205 may be coated to reduce reflection and increase the amount of beam transmitted as much as possible, so that laser power loss is decreased. Instead of irradiating the substrate with a transmitted beam from the beam splitter 205, a reflected beam from a beam splitter having high reflection efficiency may enter the substrate. Alternatively, the transmitted beam from the beam splitter 205 may be converted into circularly polarized laser beam by a quarter-wave plate before irradiation.

Figure 8A:
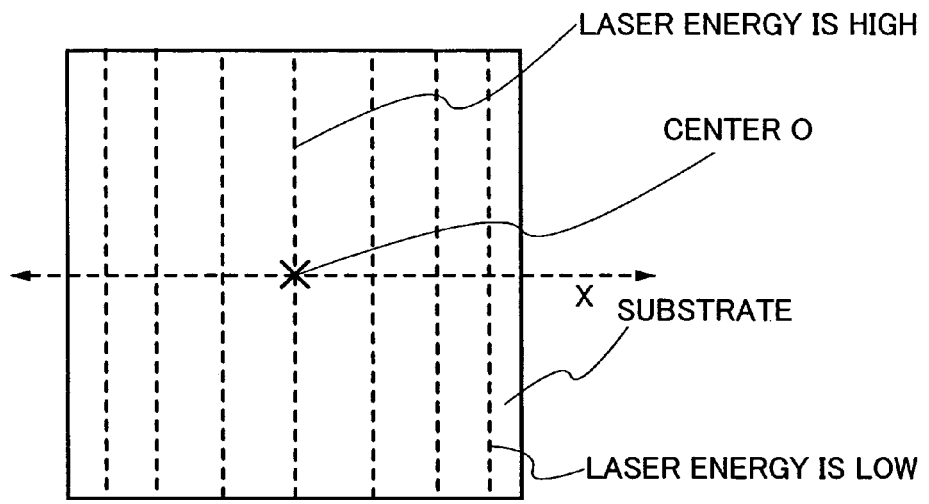
FIGS. 8A and 8B show an example of energy change in the laser beam by changing of transmittance of a lens.
Figure 8B:
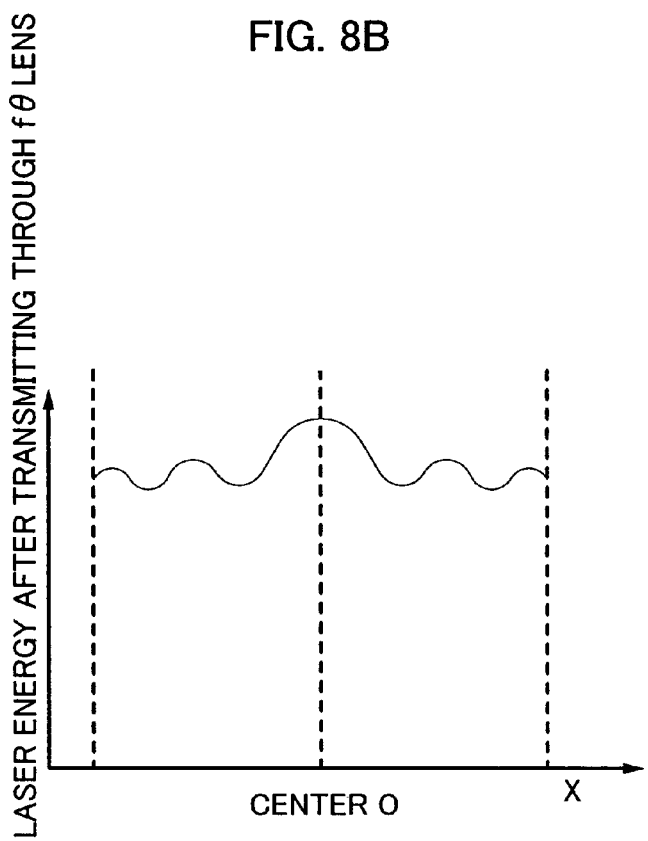

Note that, shown in FIG. 4B is merely an example of changes in irradiation energy of laser beam being scanned over the top face of the substrate. The present invention is applicable also when the laser beam energy undergoes wobbling changes as shown in FIG. 8B.

Embodiment 2

The case in which the scanning of the laser beam shown in the embodiment 1 is performed by controlling a galvanometer mirror in both X axis and Y axis directions is described in this embodiment.

Figure 6A:
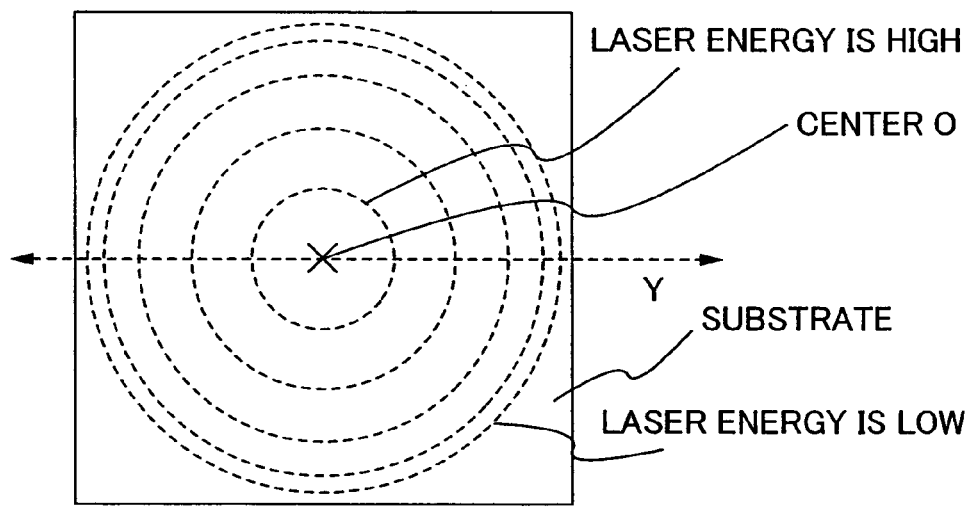
FIGS. 6A and 6B show an example of energy change in the laser beam by changing of transmittance of a lens.
Figure 6B:
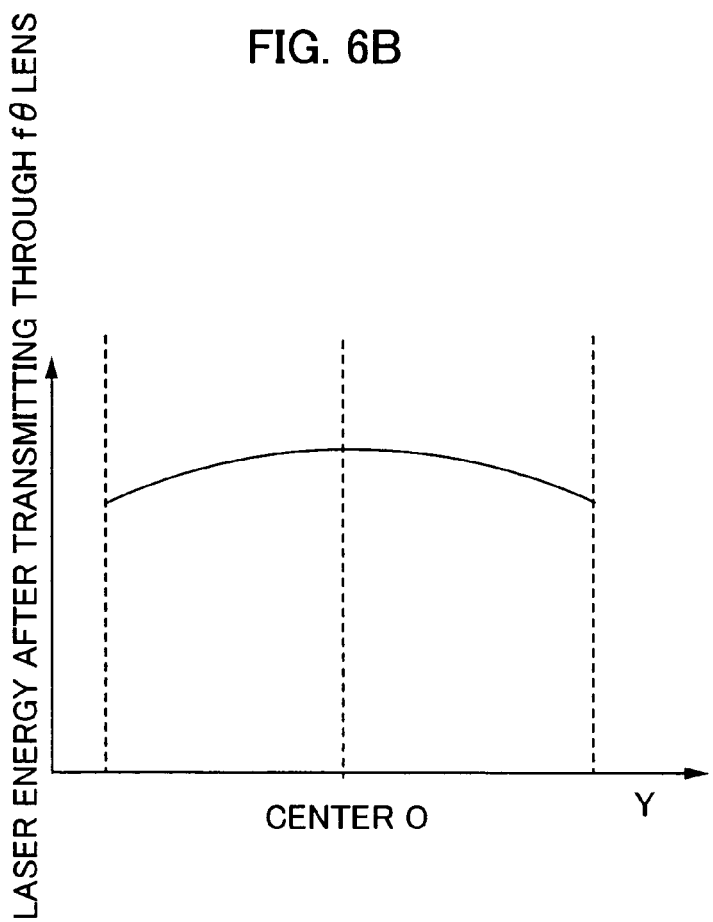

The energy of the laser beam scanned depending on the change of a transmittance is changed, since the transmittance of the f-θ lens in the apparatus changed by location. FIGS. 6A and 6B shows an example of an irradiation energy change of the laser beam scanned on a substrate. FIGS. 6A and 6B shows that laser intensity around the center of a substrate is high, while the laser intensity becomes lower concentrically from the center toward edges of the substrate. Accordingly, around the center of the substrate in which the transmittance of the lens is high, the irradiation energy change on the substrate can be suppressed by controlling the rotation of a half-wave plate so that intensity of the beam transmitted from a beam splitter can be reduced.

Figure 7A:
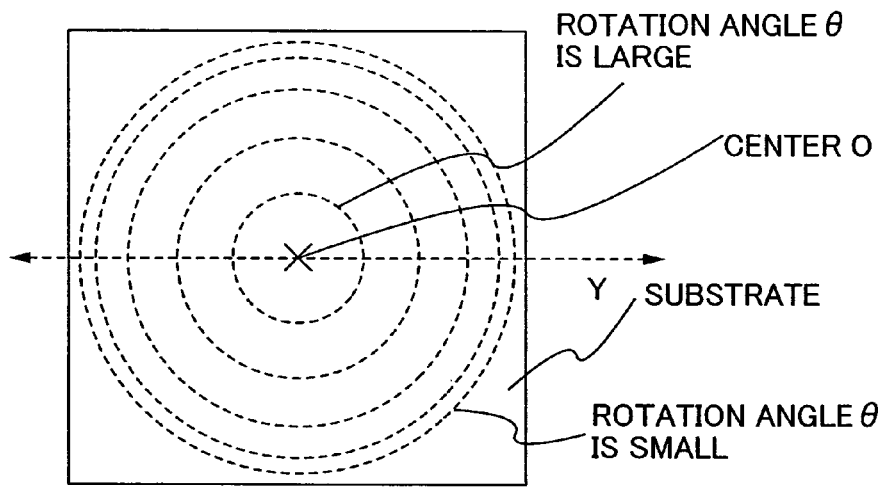
FIGS. 7A and 7B show an example of rotation angle of half-wave plate according to the present invention.
Figure 7B:
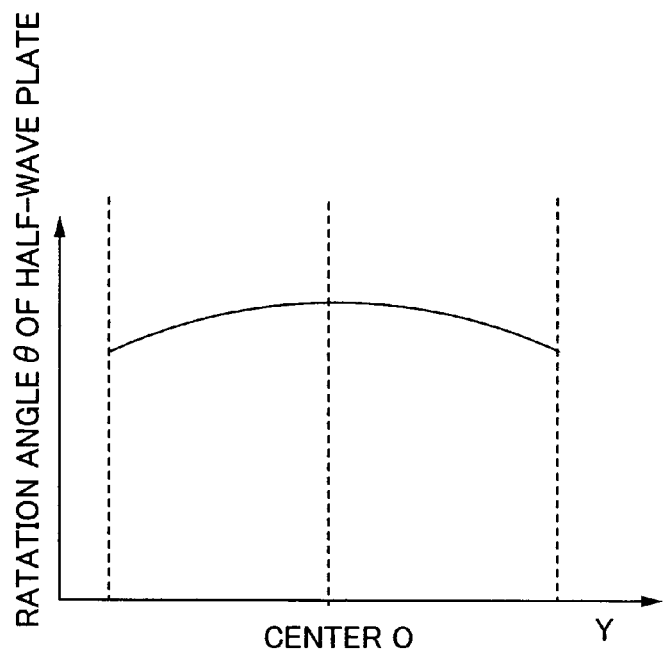

FIGS. 7A and 7B shows an example of distribution of rotation angle of the half-wave plate that can offset the energy change of the laser beam shown in FIG. 6B. In the apparatus, laser beam scanning is performed according to the distribution shown in FIGS. 7A and 7B. Note that, the rotation angle of the half-wave plate is set to in the range from 0° through 45°. According to the above described structure, it is possible to suppress change in irradiation efficiency and fluctuation in anneal effect of a substrate due to the change in transmittance of the lens.

When a semiconductor film over the substrate is crystallized by the laser, the width of the region which is formed over trace of laser irradiation and which has 10 μm or more crystal grains in diameter can be kept constant by suppressing the change in the irradiation energy on the substrate. It is noted that the branching ratio of polarization may be controlled in accordance with a desired width of the large-size grain, material of a semiconductor film, film thickness and the like.

Note that, shown in FIG. 6B shows merely an example of changes in irradiation energy of laser beam being scanned over the top face of the substrate. The present invention is applicable also when the laser beam energy undergoes wobbling changes as shown in FIG. 8B.

Embodiment 3

This embodiment describes a structure in which the half-wave plate is interposed between the optical system for shaping a beam and the galvanometer mirror.

A case in which a laser beam emitted from a laser oscillator is linearly polarized is described. Given here as an example is a case of using a laser whose polarization characteristics cause p-polarization.

A laser beam emitted from the laser oscillator is shaped by an optical system. The shaped beam enters the half-wave plate. The half-wave plate rotates around the axis that is the normal line of the half-wave plate, thereby changing the branching ratio of polarization of the incident beam. In this way, the ratio of p-polarized beam in incident beam can be increased or decreased. When the laser beam enters the half-wave plate in a manner that positions the oscillation direction of the incident beam in parallel to the optical axis direction of the half-wave plate, the laser beam, which is p-polarized beam, is transmitted through the beam splitter with a minimum energy loss. On the other hand, when the half-wave plate is rotated such that the oscillation direction of the incident beam and the optical axis of the half-wave plate form an angle θ, the ratio of s-polarized beam in laser beam that is transmitted through the half-wave plate is increased.

The laser beam transmitted through the half-wave plate enters the galvanometer mirror. The galvanometer mirror can deflect the laser beam toward the substrate direction. The incident angle and reflection angle of laser beam can be controlled for laser beam scanning by adjusting the oscillating angle of the galvanometer mirror.

The galvanometer mirror used in the apparatus of this embodiment has a polarization dependency in its reflectance and its reflectance is dependent on the polarization of a laser. For instance, when a Nd: YAG laser having a wavelength of 532 nm is used as a light source, an employable galvanometer mirror has a 98.5% reflectance for p-polarized beam and a 99.5% reflectance for s-polarized beam in a range where a laser beam enters the galvanometer mirror at such an angle that the entire top face of the substrate can be irradiated. Here, when the laser beam enters the half-wave plate with the oscillation direction of the incident beam set parallel to the optical axis direction of the half-wave plate, most of the laser beam transmitted through the half-wave plate is p-polarized beam. On the other hand, when the half-wave plate is rotated such that the oscillation direction of the incident beam and the optical axis of the half-wave plate form an angle θ, the ratio of s-polarized beam in laser beam that is transmitted through the half-wave plate is increased. Accordingly, in this case, the energy of laser beam reflected by the galvanometer mirror is larger than in a case in which the half-wave plate is not rotated. The energy of laser beam irradiation of the top face of the substrate can be controlled by the method described above. The galvanometer mirror may be coated with, for example, a dielectric multilayer film having a desired polarization dependency, thereby obtaining a mirror with a constant reflectance that is more strongly dependent on polarization at a rotation angle necessary to irradiate the entire top face of the substrate.

The laser beam reflected by the galvanometer mirror enters the f-θ lens to be collected on the substrate. Usually, the transmittance of a lens is varied depending on the position at which a laser beam enters the lens and the laser energy applied to the substrate is accordingly changed. Therefore, in this apparatus, the galvanometer mirror scans laser beams and concurrently rotation of the half-wave plate is controlled to control the laser beam energy. The rotation of the half-wave plate is controlled continuously to form a speed change pattern that can offset the beam energy change caused by a change in the transmittance of the f-θ lens. Fluctuation in energy applied to the substrate can thus be reduced. With the above structure, crystallization is achieved all over the substrate while controlling changes in energy applied to the top face of the substrate and in annealing efficiency. Structured such that the laser energy is controlled by changing the branching ratio of polarization of incident beam with the waveplate, this apparatus can easily offset fluctuation in the laser beam energy applied to the substrate even when modifications are made on the f-θ lens and other structural components of the apparatus.

The f-θ lens may be a telecentric lens. When a telecentric lens is used as the f-θ lens, a laser beam can enter the substrate at a constant angle irrespective of which part of the lens the laser beam enters and therefore the reflectance of the irradiation object can be kept constant. When the substrate receiving laser irradiation is a glass substrate or a similar substrate transmissive of laser beam, interference fringes may appear on the irradiation object on the substrate surface due to a beam reflected by the front side of the substrate and a beam reflected by the rear side of the substrate. For that reason, a laser beam may enter obliquely with respect to the substrate.

Embodiment 4

In this embodiment, processes from forming a crystalline semiconductor film by using the laser irradiation apparatus of the present invention to form a semiconductor device are described with reference to FIGS. 10A to 10D, and FIGS. 11A to 11D.

Firstly, base insulating films 1001a, 1001b are formed over a substrate 1000. An insulating substrate such as a glass substrate, a quartz substrate, a crystalline glass, and a ceramic substrate, a stainless substrate, a metal substrate (e.g., tantalum, tungsten, molybdenum), a semiconductor substrate, a plastic substrate (e.g., polyimide, acrylic, polyethylene terephthalate, polycarbonate, polyarylate, polyethersulfone), or the like can be used as the material of the substrate. In any case, a material that can resist the heat generated during the process is required to be used. In this embodiment, a glass substrate is adopted.

A silicon oxide film, a silicon nitride film, an oxynitride film and the like can be used as the base insulating films 1001a, 1001b. One film or two films or more of the insulating films are laminated by a sputtering method, a low-pressure CVD method, a plasma CVD method or the like that are publicly known. Two layers structure is adopted in this embodiment, but one layer structure or three or more layers structure may be used. In this embodiment, a silicon nitride oxide film is formed to 50 nm in thickness as the first insulating film 1001a and a silicon oxynitride film is formed to 100 nm in thickness as the second insulating film 1001b. Note that the silicon nitride oxide film is different from the silicon oxynitride film in the ratio of nitrogen and oxygen of the composition, and the former contains more nitrogen than the latter.

Next, an amorphous semiconductor film is formed. The amorphous semiconductor film which is from 25 to 80 nm in thickness is formed with a silicon or a material mainly containing a silicon (e.g., $Si_xGe_{1-x}$). The amorphous semiconductor film is formed by a sputtering method, a low-pressure CVD method, a plasma CVD method or the like that are publicly known. In this embodiment, an amorphous silicon is formed to be 66 nm in thickness.

Subsequently, the amorphous silicon film is crystallized. In this embodiment, the processes of laser annealing and crystallizing are described.

The laser irradiation apparatus of the present invention is used for the laser annealing. A continuous wave gas laser or solid state laser may be used as the laser oscillator. The gas laser includes an Ar laser, a Kr laser, and the like. The solid state laser includes a YAG laser, a $YVO_4$ laser, a YLF laser, a $YAlO_3$ laser, an alexandrite laser, a Ti: sapphire laser, and the like. One kind or plural kinds selected from the group consisting of $Cr^{3+}$, $Cr^{4+}$, $Nd^{3+}$, $Er^{3+}$, $Ce^{3+}$, $Co^{2+}$, $Ti^{3+}$, $Yb^{3+}$ is/are doped as impurity in the crystal which is a laser medium of the solid state laser.

The laser annealing is performed to crystallize the amorphous silicon by the laser irradiation apparatus of the present invention. More particularly, the laser annealing is conducted by the methods as described in Embodiments 1 to 3. In this embodiment, a $YVO_4$ laser (532 nm wavelength) with 10 W output is used and the laser beam is processed into an elliptical shaped laser beam of 20 μm in minor axis and of 750 μm in major axis and the incident angle of the laser beam to the plane to be irradiated is set to 30°. The branching ratio of polarization of the laser beam is changed to control the irradiation energy on the substrate by using the optical system having polarization dependency of the laser. The branching ratio of polarization of the laser beam is changed so as to offset the change in the irradiation energy due to the transmittance change of the f-θ lens. By changing the branching ratio of polarization of the laser beam as mentioned above, the change in the irradiation energy on the substrate can be suppressed and the width of the large-size grain region can be kept constant.

Figure 9:
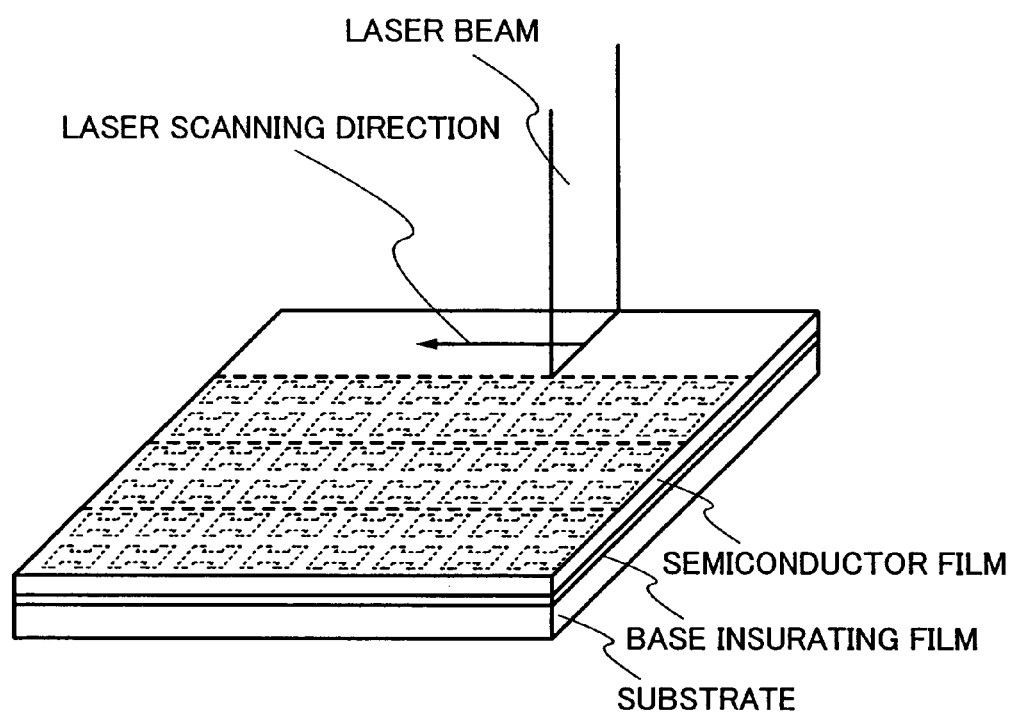
FIG. 9 shows a process of laser scanning of the present invention.
Figure 10A:
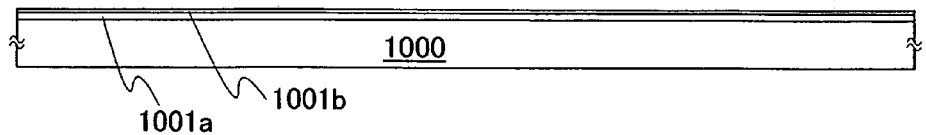
FIGS. 10A to 10D show a method of manufacturing a semiconductor device according to the present invention.
Figure 10B:
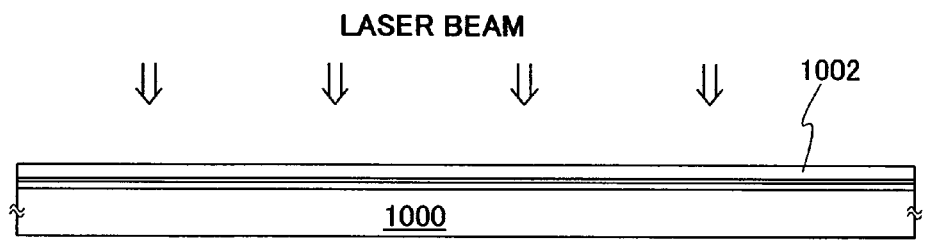
Figure 10C:
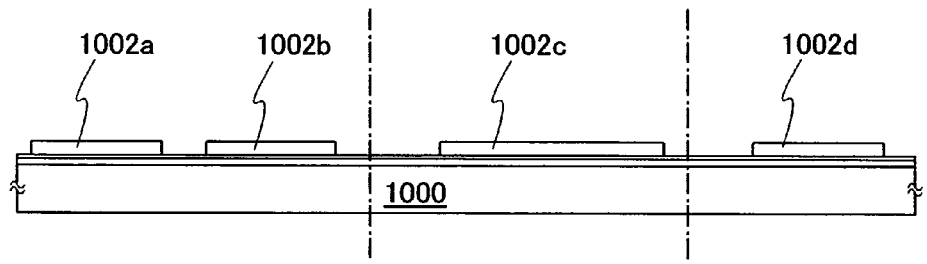
Figure 10D:
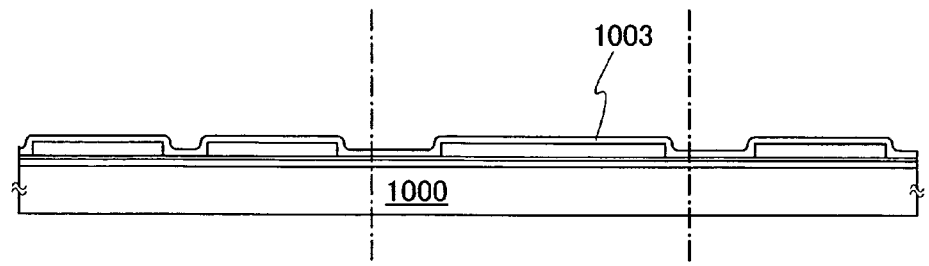
Figure 11A:
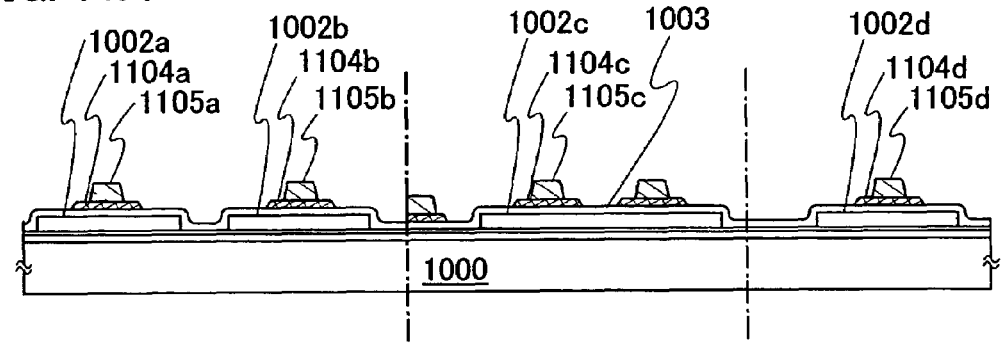
FIGS. 11A to 11D shows a method of manufacturing a semiconductor device according to the present invention.
Figure 11B:
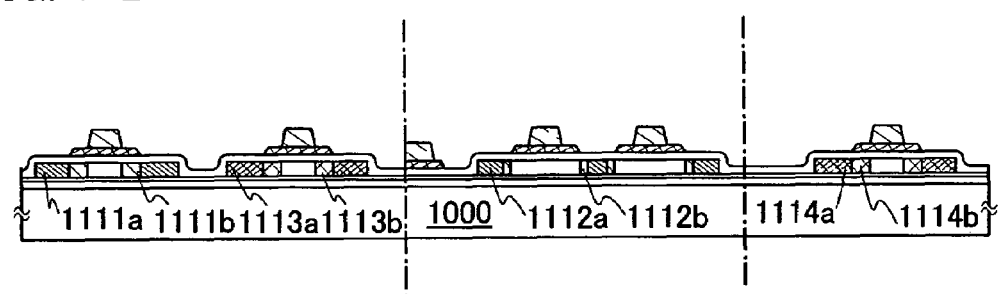
Figure 11C:
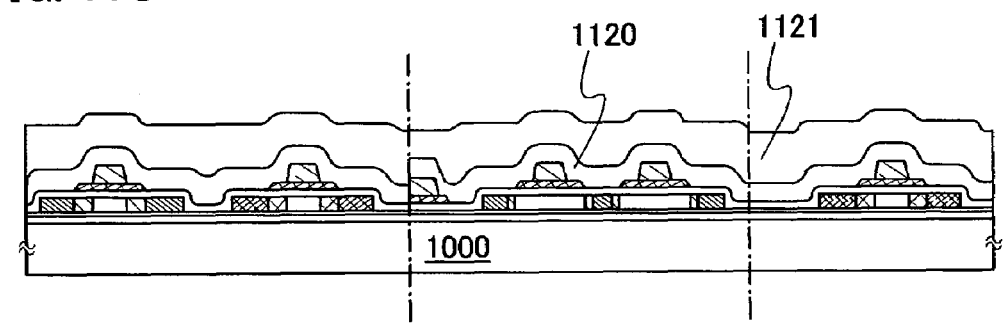
Figure 11D:
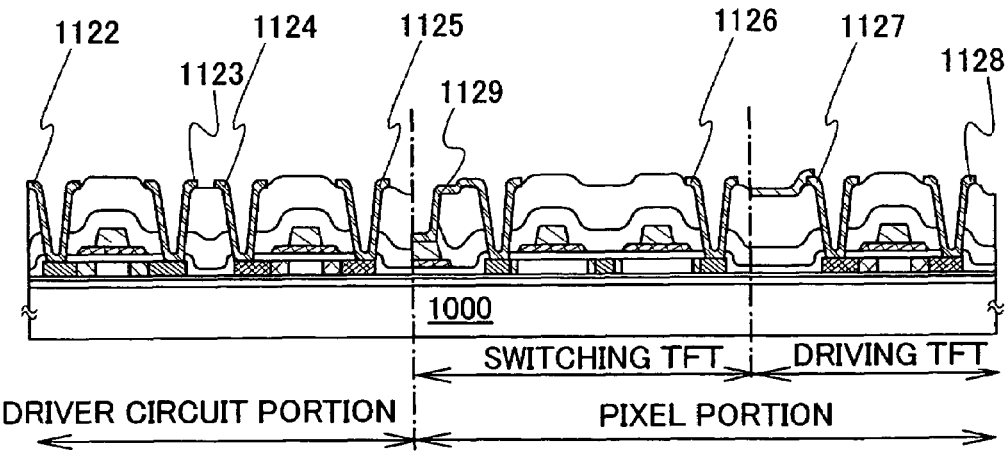

In addition, when the crystallized semiconductor film is used as an active layer of a TFT, it is preferable that the scanning direction of the laser beam be set to be parallel to a movement direction of carriers in a channel-forming region. Thus, the scanning direction of the laser beam is set to be parallel to the movement direction of carriers (channel length direction) in the channel-forming region as indicated by an arrow shown in FIG. 9. This can grow crystals along the scanning direction of the laser beam and prevent the grain boundaries from crossing with the channel length direction.

Next, the crystalline semiconductor film is processed into desired shapes 1002a to 1002d by etching. Then a gate insulating film 1003 is formed. The film thickness is set to be about 115 nm, and the insulating film containing silicon may be formed by a low-pressure CVD method, a plasma CVD method, a sputtering method or the like. In this embodiment, a silicon oxide film is formed. In this case, it can be formed by the plasma CVD method with a mixture of TEOS (Tetraethyl orthosilicate) and $O_2$ at a reaction pressure of 40 Pa, with the substrate temperature set between 300° C. and 400° C., and by discharging at a high frequency (13.56 MHz) electric power density of 0.5 W/cm$^2$ to 0.8 W/cm$^2$. The thus formed silicon oxide film can have good characteristics as a gate insulating film by subsequently performing thermal treatment at the temperature of 400° C. to 500° C.

By crystallizing a semiconductor film using the laser irradiation apparatus of the present invention, the crystalline semiconductor with good and uniform characteristics can be obtained.

Next, a tantalum nitride (TaN) is formed to be 30 nm in thickness as a first conductive layer on the gate insulating film, and tungsten (W) is formed to be 370 nm in thickness as a second conductive layer on the first conductive layer. Both the TaN film and the W film may be formed by sputtering. The TaN film is formed by sputtering using a target of Ta under a nitrogen atmosphere, while the W film is formed by sputtering using a target of W.

Note that, in this embodiment, the 30-nm-thick TaN film is used as the first conductive film, and the 370-nm-thick W film is used as the second conductive layer. However, there is no particular limitation for the conductive layers. Both the first conductive layer and the second conductive layer may be formed of the elements selected from the group consisting of Ta, W, Ti, Mo, Al, Cu, Cr, and Nd, or of an alloy material or a compound material having one of these elements as its main constituent. Further, a semiconductor film typified by a polycrystalline silicon film into which an impurity element such as phosphorus is doped may be also used. An Ag—Pd—Cu alloy may also be used. Moreover, the combination of the above materials can be applied appropriately. The first conductive layer may be formed in the range of 20 nm to 100 nm in thickness. On the other hand, the second conductive layer may be formed in the range of 100 nm to 400 nm in thickness. In addition, two-layer structure is employed in this embodiment, but a single layer structure or three or more layers structure (laminated structure) can be also employed.

Next, a mask made from resist is formed through an exposure process by a photolithography method in order to form electrodes and wirings by etching the conductive layers. The first etching process is performed under first and second etching conditions. The etching process is performed by using the resist mask to form the gate electrodes and the wirings. The etching conditions are selected appropriately.

This method adopts ICP (Inductively Coupled Plasma) etching. First etching condition includes employing as etching gas $CF_4$, $Cl_2$, and $O_2$, setting the gas flow rate ratio thereof to 25:25:10 (sccm), and applying an RF (13.56 MHz) power of 500 W to a coiled electrode at a pressure of 1.0 Pa to generate plasma for etching. The substrate side (sample stage) also receives an RF (13.56 MHz) power of 150 W so that substantially negative self bias voltage is applied. The W film is etched under those first etching condition, thereby tapering the edges of the first conductive layer. The etching rate is 200.39 nm/min. for the W film and 80.32 nm/min. for the TaN film under the first etching condition. Therefore, the selective ratio of W with respect to TaN is about 2.5. The first etching condition gives the W film a taper angle of about 26°.

Without removing the resist mask, the etching condition are changed to second etching condition, which includes employing as etching gas $CF_4$ and $Cl_2$, setting the gas flow rate ratio thereof to 30:30 (sccm), and applying an RF (13.56 MHz) power of 500 W to a coiled electrode at a pressure of 1.0 Pa to generate plasma for etching for about 15 seconds. The substrate side (sample stage) also receives an RF (13.56 MHz) power of 20 W so that substantially negative self bias voltage is applied. Under the second etching condition that includes using a mixture of $CF_4$ and $Cl_2$, the W film and the TaN film are etched to about the same degree.

The etching rate is 58.97 nm/min. for W and 66.43 nm/min. for TaN under the second etching condition. In order to etch the W film and the TaN film without leaving any residue on the gate insulating film, the etching time is preferably prolonged by 10 to 20%. Through the first etching treatment, portions of the gate insulating film that are not covered with the gate electrodes are etched by 20 to 50 nm.

The effect of the bias voltage applied to the substrate side in the first etching treatment makes the edges of the first conductive layer and of the second conductive layer into tapered shape.

Next, second etching treatment is carried out without removing the resist mask. In the second etching treatment, $SF_6$, $Cl_2$ and $O_2$ are employed as etching gas, the gas flow rate ratio thereof is set to 24:12:24 (sccm), and an RF (13.56 MHz) power of 700 W is applied to the coil at a pressure of 1.3 Pa to generate plasma for etching for about 25 seconds. The substrate side (sample stage) also receives an RF (13.56 MHz) power of 10 W so that substantially negative self bias voltage is applied. Under those etching conditions, the W film is selectively etched to form second shape conductive layers. The first conductive layer is hardly etched in the second etching treatment. Through the first and second etching treatment, gate electrodes formed from first conductive 1104a to 1104d and second conductive layers 1105a to 1105d are obtained.

Still keeping the resist mask in place, first doping treatment is performed to lightly dope the crystalline semiconductor layers with an impurity that gives the layers the N type conductivity. The first doping treatment employs ion doping or ion implantation. Ion doping condition includes setting the dose amount to $1\times10^{13}$ to $5\times10^{14}$ atoms/cm$^2$ and the acceleration voltage to 40 to 80 kV. In this embodiment, the acceleration voltage is set to 50 kV. The impurity element used to impart the N type conductivity is one that belongs to Group 15 in the periodic table of the elements, typically, phosphorus (P) or arsenic (As). This embodiment employs phosphorus (P). The first doping treatment uses the first conductive layers as masks to lightly dope the semiconductor layers with the impurity. Thus formed in a self-aligning manner are first impurity regions (N$^-$ regions).

The resist mask is removed and a new resist mask is formed for second doping treatment in which the acceleration voltage is set higher than in the first doping treatment. The second doping treatment is also for doping the semiconductor layers with an impurity that imparts the N type conductivity. Ion doping condition includes setting the dose amount to $1\times10^{13}$ to $3\times10^{15}$ atoms/cm$^2$ and the acceleration voltage to 60 to 120 kV. In this embodiment, the dose amount is set to $3\times10^{15}$ atoms/cm$^2$ and the acceleration voltage is set to 65 kV. The second doping treatment uses the second conductive layers as masks against the impurity element so that the semiconductor layers positioned under the first conductive layers can also be doped with the impurity element.

Through the second doping treatment, second impurity regions (N⁻ regions, Lov regions) are formed in portions of the crystalline semiconductor layers that overlap with the first conductive layers but not with the second conductive layers, or portions of the crystalline semiconductor layers that overlap with the first conductive layers and are not covered with masks. The second impurity regions contain an impurity that imparts the N type conductivity in a concentration of $1\times10^{18}$ to $5\times10^{19}$ atoms/cm³. Exposed portions of the crystalline semiconductor films that are not covered with the first shape conductive layers or masks are heavily doped with the impurity that imparts the N type conductivity (third impurity regions: N⁺ regions). The impurity concentration in the third impurity regions is $1\times10^{19}$ to $5\times10^{21}$ atoms/cm³. Some of N⁺ regions in the semiconductor layers are covered with only a portion of masks. In those portions, the concentration of the impurity that imparts the N type conductivity has been unchanged since the first doping treatment and therefore the portions are continuously referred to as first impurity regions (N⁻ regions).

Although the first through third impurity regions are formed by performing doping treatment twice in this embodiment, the present invention is not limited thereto. If doping conditions are set properly, impurity regions having desired impurity concentrations can be formed by doping once or more times.

Then, the resist mask is removed and a new resist mask is formed for third doping treatment. Through the third doping treatment, fourth impurity regions (P⁺ regions) and fifth impurity regions (P⁻ regions) are formed in the semiconductor layers that are to form p-channel TFTs. The fourth and fifth impurity regions are doped with an impurity element that imparts the conductivity opposite to that of the first and second impurity regions.

In the third doping treatment, the fourth impurity regions (P⁺ regions) are formed in portions of the semiconductor layers that are not covered with the resist mask and that do not overlap with the first conductive layers whereas the fifth impurity regions (P⁻ regions) are formed in portions of the semiconductor layers that are not covered with the resist mask and that overlap with the first conductive layers but not with the second conductive layers. Impurity elements known to impart the P type conductivity are Group 13 elements in the periodic table of the elements, such as boron (B), aluminum (Al), and gallium (Ga).

This embodiment adopts boron (B) as a P type impurity element to form the fourth impurity regions and the fifth impurity regions. Ion doping using diborane ($B_2H_6$) is employed and condition for the ion doping includes setting the dose amount to $1\times10^{16}$ atoms/cm², and the acceleration voltage to 80 kV During the third doping treatment, the semiconductor layers for forming n-channel TFTs are covered with a resist mask.

The fourth impurity regions (P⁺ regions) and the fifth impurity regions (P⁻ regions) have been doped with phosphorus in different concentrations in the first and second doping treatment. However, the third doping treatment gives each of the fourth impurity regions (P⁺ regions) and the fifth impurity regions (P⁻ regions) a P type impurity element concentration of $1\times10^{19}$ to $5\times10^{21}$ atoms/cm². Therefore, the fourth impurity regions (P⁺ regions) and the fifth impurity regions (P⁻ regions) have no problem in functioning as source regions and drain regions of p-channel TFTs.

Although the fourth impurity regions (P⁺ regions) and the fifth impurity regions (P⁻ regions) are formed by only the third doping treatment in this embodiment, the present invention is not limited thereto. The fourth impurity regions (P⁺ regions) and the fifth impurity regions (P⁻ regions) may be formed by doping more than once if doping treatment conditions are set properly.

Through the first to third doping treatment, first impurity regions (N⁻ regions) 1112b, second impurity regions (N⁻ regions, Lov regions) 1111b, third impurity regions (N⁺ regions) 1111a and 1112a, fourth impurity regions (P⁺ regions) 1113a 1114a, and fifth impurity regions (P⁻ regions) 1113b and 1114b are formed.

Next, the resist mask is removed to form a first passivation film 1120. The first passivation film 1120 is an insulating film containing silicon and has a thickness of 100 to 200 nm. Plasma CVD or sputtering is employed to form the first passivation film 1120. The film 1120 in this embodiment is a silicon oxynitride film formed by plasma CVD to have a thickness of 100 nm. The silicon oxynitride film formed by plasma CVD uses a combination of $SiH_4$, $N_2O$ and $NH_3$, or a combination of $SiH_4$ and $N_2O$. Conditions for forming the silicon oxynitride film from such materials include setting the reaction pressure for 20 to 200 Pa, the substrate temperature for 300 to 400° C., and the high frequency (60 MHz) power density to 0.1 to 1.0 W/cm². Alternatively, the first passivation film 1120 may be a hydrogen silicon oxynitride film formed from $SiH_4$, $N_2O$, and $H_2$. The first passivation film 1120 is not limited to a single-layer of silicon oxynitride as used in this embodiment, but may be a single layer or plural layers (laminated structure) of other insulating films containing silicon.

Thereafter, the crystallinity of the semiconductor layers is restored and the impurity elements used to dope the semiconductor layers are activated through laser annealing by using the laser irradiation apparatus of the present invention. In this embodiment, a 1.8 W power $YVO_4$ laser (wavelength: 532 nm) is employed, and the laser beam is processed and shaped into an elliptical shape having a minor axis of 20 μm and a major axis of 250 μm. The semiconductor layers are scanned with this laser beam 800 times at a 125 μm pitch with the laser scanning rate set to 25 cm/sec. Instead of laser annealing, heat treatment or rapid thermal annealing (RTA) may be applied.

Heat treatment following formation of the first passivation film 1120 can achieve hydrogenation of the semiconductor layers as well as activation. In the hydrogenation process, dangling bonds in the semiconductor layers are terminated with hydrogen contained in the first passivation film.

The heat treatment may be performed before formation of the first passivation film 1120. However, if the first conductive layers 1104a to 1104d and the second conductive layers 1105a to 1105d are formed from materials that are weak against heat, formation of the first passivation film 1120 desirably precedes the heat treatment as in this embodiment in order to protect wires and the like. Furthermore, when the heat treatment is performed before forming the first passivation film, the hydrogenation process utilizing hydrogen contained in the passivation film cannot be achieved by lack of the first passivation film.

In this case, the hydrogenation process may employ plasma hydrogenation which utilizes hydrogen excited by plasma, or heat treatment at 300 to 450° C. for 1 to 12 hours under an atmosphere containing 3 to 100% of hydrogen.

Next, a first interlayer insulating film 1121 is formed on the first passivation film 1120. Used as the first interlayer insulating film can be an inorganic insulating film or an organic insulating film. Examples of employable inorganic insulating film include such as a silicon oxide film formed by CVD and a silicon oxide film obtained through application by SOG (Spin On Glass). Examples of employable organic insulating film include such as a polyimide film, a polyamide film, a BCB (benzocyclobutene) film, an acrylic or positive photosensitive organic resin film, and a negative photosensitive organic resin film. A laminated structure of an acrylic film and a silicon oxynitride film may also be used.

The interlayer insulating film can be formed from a material in which the bond between silicon (Si) and oxygen (O) constitutes the framework structure and in which at least hydrogen is included in its substituents. Another material can be used to form the interlayer insulating film if the interlayer insulating film has in its constituents at least one out of fluorine, alkyl, and aromatic hydrocarbon. A typical example of those materials is siloxane-based polymers.

Siloxane-based polymers are classified by structure into, for example, silica glass, alkyl siloxane polymers, alkylsilsesquioxane polymers, hydrogen silsesquioxane polymers, and hydrogen alkylsilsesquioxane polymers.

Alternatively, the interlayer insulating film may be formed from a material that contains polymer having Si—N bonds (polysilazane).

By using any of the above-mentioned materials, an interlayer insulating film that can be thinned without losing necessary insulating ability and flatness is obtained. In addition, the materials have high heat resistance and therefore the obtained interlayer insulating film can withstand reflow treatment in multi-layer wiring. Moreover, having low hygroscopic property, any of the materials can form an interlayer insulating film that allows only a small amount of water to escape.

The first interlayer insulating film in this embodiment is a non-photosensitive acrylic film with a thickness of 1.6 μm. The first interlayer insulating film covers the surface irregularities, which are caused by TFTs formed over the substrate, to flatten the surface irregularities. In particular, since the major purpose of the first interlayer insulating film is to flatten the surface irregularities, an insulating film formed of a material that is flattened easily is preferable as the first interlayer insulating film.

After that, a second passivation film (not shown in the drawings) is formed on the first interlayer insulating film using a silicon nitride-oxide film or the like. The second passivation film has a thickness of 10 to 200 nm and prevents moisture from entering and exiting the first interlayer insulating film. Other than a silicon nitride oxide film, a silicon nitride film, an aluminum nitride film, an aluminum oxynitride film, a diamond-like carbon (DLC) film, and a carbon nitride (CN) film can similarly be used as the second passivation film.

A film formed by RF sputtering has high density and is excellent as a barrier. For example, when a silicon oxynitride film is to be formed by RF sputtering, condition includes using a Si target and $N_2$, Ar and $N_2O$, and setting the gas flow rate ratio to 31:5:4, the pressure to 0.4 Pa, and the electric power to 3000 W. For example, when a silicon nitride film is to be formed by RF sputtering, condition includes using a Si target and $N_2$ and Ar, and setting the gas flow rate ratio in the chamber to 20:20, the pressure to 0.8 Pa, the electric power to 3000 W, and the film formation temperature to 215° C. The second passivation film in this embodiment is a silicon oxynitride film formed by RF sputtering to have a thickness of 70 nm.

Next, the second passivation film, the first interlayer insulating film, and the first passivation film are etched to form contact holes that reach the third impurity regions and the fourth impurity regions.

Then, wiring and electrodes are formed to be electrically connected to the impurity regions each. The wirings are formed by patterning a laminate film of a 50 nm thick Ti film and a 500 nm thick alloy (Al—Ti alloy) film. The laminate is not limited to a two-layer structure and may have a single-layer structure or a multi-layer structure with 3 or more layers (laminated structure), of course. The wiring materials are not limited to Al and Ti. For instance, a laminate film, which is obtained by placing an Al film or a Cu film on a TaN film and then topping the two layers with a Ti film, may be patterned to form the wirings.

As described above, a semiconductor device manufactured by using the laser irradiation apparatus of the present invention exhibits excellent and uniform characteristics and therefore can be utilized suitably in various electronic devices, in particular, display devices. In addition, the reliability of such products is enhanced.

The laser irradiation apparatus of the present invention has a galvanometer mirror and an f-θ lens. An object can be irradiated with a laser beam while the irradiation energy is being controlled by using a half-wave plate that controls the branching ratio of polarization of the laser beam in sync with the movement of the galvanometer mirror and an optical system of which transmittance or reflectance depends on the direction of polarization. The laser irradiation apparatus of the present invention can make it possible that laser annealing to an object to be irradiated (a semiconductor film) can be performed with a high throughput. Further, fluctuation in characteristics among plural semiconductor elements that are formed by laser annealing to the semiconductor film can be suppressed. For these reasons, the present invention is so profitable industrially.

What is claimed is:

1. A method of manufacturing a semiconductor device, comprising the steps of:
    processing a laser beam outputted from a laser oscillator in order to shape a beam spot into a linear shape or an elliptical shape;
    controlling a branching ratio of polarization of the processed laser beam;
    transmitting a laser beam having a polarized direction through an optical system depending on the polarization direction after controlling the branching ratio of polarization of the processed laser beam;
    deflecting the transmitted laser beam toward a surface of a semiconductor film;
    shaping the beam spot at arbitrary coordinates on the surface to be irradiated; and
    performing laser annealing on the semiconductor film,
    wherein the control of the branching ratio of polarization offsets a beam energy change associated with a position on the surface irradiated by the beam.

2. A method of manufacturing a semiconductor device according to claim 1, wherein the laser beam is outputted from a continuous wave solid state laser.

3. A method of manufacturing a semiconductor device according to claim 1, wherein the laser oscillator is a continuous wave laser selected from the group consisting of a YAG laser, a $YVO_4$ laser, a YLF laser, a $YAlO_3$ laser, a $Y_2O_3$ laser, an alexandrite laser, and a Ti: sapphire laser.

4. A method of manufacturing a semiconductor device according to claim 2, wherein the laser beam is outputted from a continuous wave laser selected from the group consisting of a YAG laser, a $YVO_4$ laser, a YLF laser, a $YAlO_3$ laser, a $Y_2O_3$ laser, an alexandrite laser, and a Ti: sapphire laser.

5. A method of manufacturing a semiconductor device according to claim 1, wherein the laser beam is outputted from a continuous wave Ar laser or a continuous wave Kr laser.

6. A method of manufacturing a semiconductor device according to claim 1, wherein the laser oscillator outputs a harmonic wave.

7. A method of manufacturing a semiconductor device according to claim 4, wherein the laser oscillator outputs a harmonic wave.

8. A method of manufacturing a semiconductor device according to claim 5, wherein the laser oscillator outputs a harmonic wave.

9. A method of manufacturing a semiconductor device according to claim 1, wherein a half wave plate is rotated to control the branching ratio of polarization of the processed laser beam.

10. A method of manufacturing a semiconductor device according to claim 1, wherein the optical system comprises a beam splitter.

11. A method of manufacturing a semiconductor device according to claim 10, wherein the beam splitter selectively transmits p-polarized laser beam or s-polarized laser beam.

12. A method of manufacturing a semiconductor device according to claim 1, wherein the step of deflecting is performed using a galvanometer mirror.

13. A method of manufacturing a semiconductor device, comprising the steps of:
processing a laser beam outputted from a laser oscillator in order to shape a beam spot into a linear shape or an elliptical shape;
controlling a branching ratio of polarization of the processed laser beam;
transmitting a laser beam having a polarized direction through an optical system depending on the polarization direction after controlling the branching ratio of polarization of the processed laser beam;
deflecting the transmitted laser beam toward a surface of a semiconductor film; and
scanning the deflected laser beam through an f-θ lens to the semiconductor film,
wherein the control of the branching ratio of polarization offsets a difference in beam energy distribution associated with the scanning of the deflected laser beam on the surface of the semiconductor film.

14. A method of manufacturing a semiconductor device according to claim 13, wherein the laser beam is outputted from a continuous wave solid state laser.

15. A method of manufacturing a semiconductor device according to claim 13, wherein the laser oscillator is a continuous wave laser selected from the group consisting of a YAG laser, a YVO$_4$ laser, a YLF laser, a YAlO$_3$ laser, a Y$_2$O$_3$ laser, an alexandrite laser, and a Ti: sapphire laser.

16. A method of manufacturing a semiconductor device according to claim 13, wherein the laser beam is outputted from a continuous wave laser selected from the group consisting of a YAG laser, a YVO$_4$ laser, a YLF laser, a YAlO$_3$ laser, a Y$_2$O$_3$ laser, an alexandrite laser, and a Ti: sapphire laser.

17. A method of manufacturing a semiconductor device according to claim 13, wherein the laser beam is outputted from a continuous wave Ar laser or a continuous wave Kr laser.

18. A method of manufacturing a semiconductor device according to claim 13, wherein the laser oscillator outputs a harmonic wave.

19. A method of manufacturing a semiconductor device according to claim 16, wherein the laser oscillator outputs a harmonic wave.

20. A method of manufacturing a semiconductor device according to claim 17, wherein the laser oscillator outputs a harmonic wave.

21. A method of manufacturing a semiconductor device according to claim 13, wherein a half wave plate is rotated to control the branching ratio of polarization of the processed laser beam.

22. A method of manufacturing a semiconductor device according to claim 13, wherein the optical system comprises a beam splitter.

23. A method of manufacturing a semiconductor device according to claim 22, wherein the beam splitter selectively transmits p-polarized laser beam or s-polarized laser beam.

24. A method of manufacturing a semiconductor device according to claim 13, wherein the steps of deflecting and scanning are performed using a galvanometer mirror.

25. A method of manufacturing a semiconductor device, comprising the steps of:
processing a laser beam outputted from a laser oscillator in order to shape a beam spot into a linear shape or an elliptical shape;
controlling a branching ratio of polarization of the processed laser beam;
transmitting a laser beam having a polarized direction through an optical system depending on the polarization direction after controlling the branching ratio of polarization of the processed laser beam;
deflecting the transmitted laser beam toward a surface of a semiconductor film; and
scanning the deflected laser beam through an f-θ lens to the semiconductor film,
wherein the control of the branching ratio of polarization offsets a difference in beam energy distribution, the difference being caused by a position of the laser beam incident on the f-θ lens.

26. A method of manufacturing a semiconductor device according to claim 25, wherein the laser beam is outputted from a continuous wave solid state laser.

27. A method of manufacturing a semiconductor device according to claim 25, wherein the laser oscillator is a continuous wave laser selected from the group consisting of a YAG laser, a YVO$_4$ laser, a YLF laser, a YAlO$_3$ laser, a Y$_2$O$_3$ laser, an alexandrite laser, and a Ti: sapphire laser.

28. A method of manufacturing a semiconductor device according to claim 25, wherein the laser beam is outputted from a continuous wave laser selected from the group consisting of a YAG laser, a YVO$_4$ laser, a YLF laser, a YAlO$_3$ laser, a Y$_2$O$_3$ laser, an alexandrite laser, and a Ti: sapphire laser.

29. A method of manufacturing a semiconductor device according to claim 25, wherein the laser beam is outputted from a continuous wave Ar laser or a continuous wave Kr laser.

30. A method of manufacturing a semiconductor device according to claim 25, wherein the laser oscillator outputs a harmonic wave.

31. A method of manufacturing a semiconductor device according to claim 28, wherein the laser oscillator outputs a harmonic wave.

32. A method of manufacturing a semiconductor device according to claim 29, wherein the laser oscillator outputs a harmonic wave.

33. A method of manufacturing a semiconductor device according to claim 25, wherein a half wave plate is rotated to control the branching ratio of polarization of the processed laser beam.

34. A method of manufacturing a semiconductor device according to claim 25, wherein the optical system comprises a beam splitter.

35. A method of manufacturing a semiconductor device according to claim 34, wherein the beam splitter selectively transmits p-polarized laser beam or s-polarized laser beam.

36. A method of manufacturing a semiconductor device according to claim 25, wherein the steps of deflecting and scanning are performed using a galvanometer mirror.

* * * * *